Aug. 9, 1966 D. P. BURKS ETAL 3,265,806

ENCAPSULATED FLAT PACKAGE FOR ELECTRONIC PARTS

Filed April 5, 1965

INVENTORS
Darnall P. Burks
John H. Fabricius
BY Connolly and Hutz
ATTORNEYS

United States Patent Office 3,265,806
Patented August 9, 1966

3,265,806
ENCAPSULATED FLAT PACKAGE FOR ELECTRONIC PARTS

Darnall P. Burks, Williamstown, Mass., and John H. Fabricius, Stamford, Vt., assignors to Sprague Electric Company, North Adams, Mass., a corporation of Massachusetts Filed Apr. 5, 1965, Ser. No. 445,484
3 Claims. (Cl. 174—52)

This invention relates generally to a flat packed electronic module and more particularly to a combination of electronic elements incapsulated on a nonconducting substrate having external bonded leads.

In the construction of flat packed elements on a nonconducting substrate, the attachment of leads to electrodes in the pack is important to the production of a satisfactory device. The leads must be securely bonded in the pack and electrically connected to metallized areas on the substrate. The miniaturized form of the device requires the maximum reduction of the volume. One section of the pack where this may be achieved is in the joints between the parts. For example, the solder joints between the leads, the metallized areas and the other components are preferably of minimum bulk. At the same time, the connection and retention of the external leads in the flat pack must be low in cost. The flat pack has particular advantage in its compactness and in its low profile. The rectangular shape of the flat pack is also particularly advantageous in its adaptation to microcircuitry techniques. On the other hand, the external leads extending laterally from the edge of the pack present problems in secure attachment and positive electrical connection.

An object of this invention is to provide a strong bond of flat lead elements on a substrate in a flat pack.

Another object of this invention is to provide a flat pack construction in which the flat leads can be readily bonded to the metallized areas on a substrate.

A further object of this invention is a flat pack construction adapted to assist the incapsulation of electronic elements on a nonconducting substrate.

A still further object of this invention is to provide a low cost, rugged, flat pack designed for automated assembly.

Still another object of this invention is the provision of a novel method of joining, bonding, sealing and enclosing the elements and parts of a flat pack incorporating electronic elements, a nonconducting substrate, and a frame.

These and other objects of this invention will become more apparent upon consideration of the following description taken together with the accompanying drawings in which.

Figure 1:
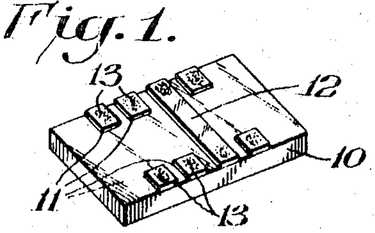
FIGURE 1 is a perspective view of a typical metallized substrate used in this invention carrying a resistive element.

In accordance with the present invention, a flat pack comprises an insulating support carrying electronic elements having a nonconducting frame mating with spaced terminals of those elements. The frame is joined to the support by a bond which embraces the lead members, and sandwiches them between the support and the frame in electrical contact with the terminals. In a preferred form, the frame receives potting material which incapsulates the package, including the elements.

In a more particular aspect of this invention, metallized areas interconnecting electronic circuit elements on a nonconducting substrate are mated with recesses in a castellated nonconducting frame. These recesses carry bonding material so that the leads are gripped in position between the substrate and the frame and held in electrical contact with the metallized areas. The bonding material is provided by portions of fusible material within each recess. The material is separated and isolated, in each recess by portions of the frame which abut the substrate between recesses and are free from such material. Thus held by the castellated frame, the leads are tightly secured in position, and separated and insulated. In the method of producing the package, the bonding of the castellated frame to the substrate may be effected by soldering or vitreous fusing.

In other particular aspects of this invention, the assembly construction may be formed of a nonconducting substrate having metallized areas interconnecting electronic circuit elements on the substrate and a nonconducting flat frame carrying mating metallized areas. The frame is joined to the metallized substrate with the metallized areas mated and engaging laterally extending flat leads, and the two nonconducting members adhered together as described in the above castellated frame.

In its preferred embodiment, the assembly of this invention has a castellated frame of alumina and a suitable nonconducting substrate of glass, porcelain, steatite, or other ceramic which is metallized on one surface with metallized areas. Solder is mounted on the metallizations. The castellated frame in its recessed portions carries mating fusible material. Flat lead members are positioned between the two fusible materials which are fused together with the flat leads sandwiched between them. The alumina frame has an open center, and the substrate carries electronic elements underlying this open center in connection to the metallized areas. A potting material filled in the open center incapsulates the elements. The potting material is retained so as to complete the structure.

The first step in the construction of a flat pack, in accordance with this invention, is the metallization of the nonconducting substrate and the application of solder, brazing or other suitable material to the metallized areas. The substrate is made up of a suitable material such as glass, ceramic, resin, or the like. A thin film or printed circuit may be applied to this base in connection to the metallized areas. As for example, a resistor composition, such as carbon compositions, metals, alloys or oxides, may be applied to produce a resistor or resistors of appropriate resistivity depending upon the end value desired. Similarly, other electronic elements, such as semiconductors, thin film capacitors, integrated circuits, etc. may be incorporated in the circuitry on the substrate, or mounted on the substrate and connected to the metallized areas. Furthermore, discrete components such as resistors, capacitors, inductors, etc. may also be mounted on the substrate and connected to the metallized areas at this time.

In the next step leads are held on the solder coated metallized areas of the wafer substrate. These leads extend laterally from the substrate and provide for electrical connection into the package.

In the next step, with the leads suitably held in position in contact with the solder, a frame, having solder or other fusible material mounted thereon, is mated with the leads and the solder coated metallized areas of the substrate. The solder on the frame is then fused to the solder on the substrate to form a bond of the substrate, the frame and the leads. In the next intermediate step additional components may be connected on the substrate.

In the final step, a protective coating is applied to the bonded substrate and frame as by incapsulation in a suitable potting material, such as an epoxy resin.

Thereafter, the package is prepared for use such as by any treatment of the leads that may be necessary to condition them for assembly in an electronic device.

The construction of a preferred embodiment of this invention is illustrated in FIGURES 1–5. FIGURE 1 shows a nonconductive substrate 10 on which metallized areas 11 and a thin film resistor 12 are mounted by suitable means of application. Also, solder 13 is applied to the metallized areas 11. The resistor 12 is representative of the circuitry which may be assembled on the substrate 10 in this step of the preparation of the package.

Figure 2:
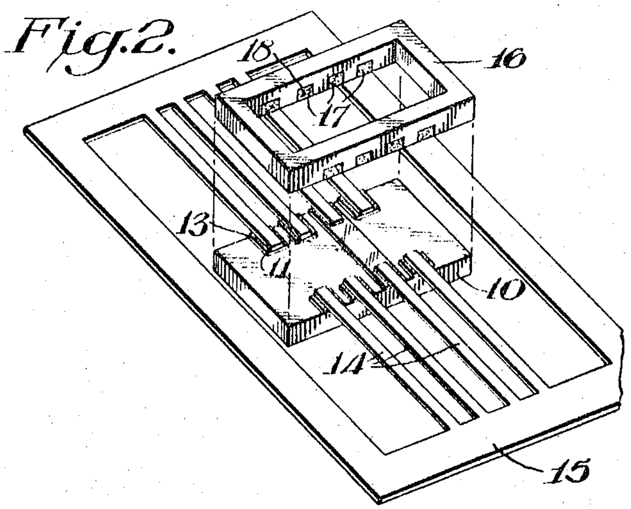
FIGURE 2 is an exploded view of a castellated frame and the substrate of FIGURE 1 with a semi-finished piece placing leads in contact with the metallized substrate.

In FIGURE 2, the substrate 10 and its applied parts, the metallized area 11, the resistor 12 and the solder 13, are shown with flat leads 14 positioned with ends in contact with respective solder 13. The flat leads 14 are part of a semi-finished piece 15. Suitable methods of forming the piece 15 and its leads 14 are by stamping or etching from a flat sheet of metal. In the exploded view of FIGURE 2, a castellated frame 16 is shown positioned in alignment with the substrate 10 so that recesses 17 of the frame 16 are aligned with various leads 14 and their respective solder 13. Each recess 17 contains a portion of solder 18.

Figure 3:
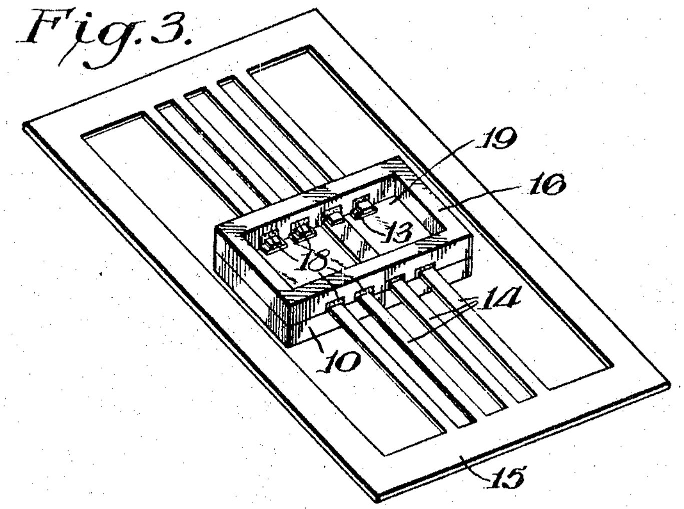
FIGURE 3 is a perspective view of the substrate and castellated frame joined in mated position with the leads secured between the substrate and the frame.
Figure 4:
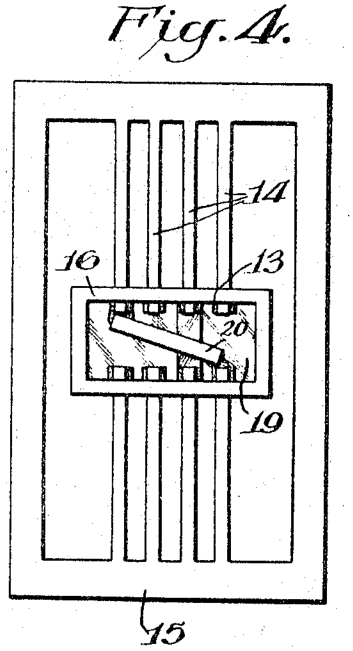
FIGURE 4 is a plan view of the joined frame and substrate showing the leads and elements mounted on the substrate.

FIGURE 3 shows the substrate 10 and the frame 16 joined and bonded together by solder 18 in the recesses 17 and the solder 13 of the substrate 10. The solder 18 and the mating solder 13 sandwich the respective flat leads 14 between the bonding solder elements to grip the ends of the leads 14 between the substrate 10 and the frame 16, as well as to bond the substrate 10 and frame 16 together. In this condition as seen in FIGURES 3 and 4, the bonded structure of the substrate 10 and the frame 16 are connected to the leads 14 of the piece 15. The frame 16 of this embodiment encloses a central uncovered area 19 through which the circuitry on the substrate 10 is accessible. An electrical component 20 is attached in the circuit in the open area 19 by attachment to two of the leads 14, as illustrated in FIGURE 4.

Figure 5:
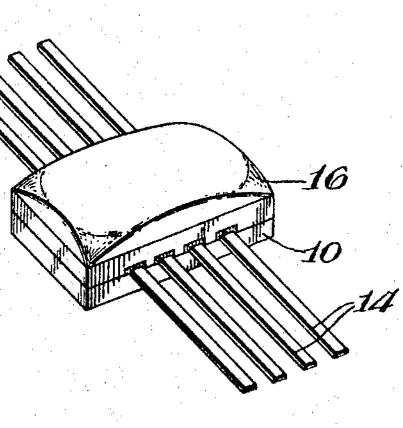
FIGURE 5 is a perspective view of the finished incapsulated flat pack of this invention.

A suitable potting material 20 is then introduced into the open area 19 to incapsulate the exposed circuitry and components, and to provide a finished package as shown in FIGURE 5. In the final step to produce the finished package, the leads 14 are severed from the piece 15 to provide the incapsulated package with extended leads as in FIGURE 5.

One modification of the above described embodiment is that in which, instead of the centrally open frame 16, a closed frame is used. In such case, all electronic elements are connected upon it before the substrate 10 is bonded to the frame. After bonding, the assembly is then sealed by filling the pack through an appropriate aperture in the substrate 10 or the closed frame; or by other suitable means, such as by adding a sealing coat around the joint where the substrate 10 meets the closed frame.

Although the invention has been described herein in terms of a specific embodiment, it should be understood that many different embodiments may be made without departing from the spirit and scope hereof, and that the invention is not limited except as defined in the appended claims.

What is claimed is:

1. An assembly of mounted electronic parts comprising a nonconductive substrate, thin film metal terminals on the substrate interconnecting electronic parts thereon, a fusible conductive material on and electrically connected to the terminals, a plurality of external leads extending from the substrate having ends adhered to and in electrical contact with the fusible conductive material, a nonconducting frame joined to the substrate over the metal terminals and the leads, and separated portions of fusible material on the frame bonded to the matching portions of the fusible material on the metal terminals whereby the leads are electrically connected to the terminals secured in the assembly.

2. An assembly of mounted electronic parts comprising a nonconductive substrate, thin film metal terminals on the substrate interconnecting electronic parts thereon, electrical solder on the individual terminals, a plurality of external leads extending from the substrate having ends adhered to and in electrical contact with the respective solder on the terminals, a nonconducting frame joined to the substrate over the terminals and the ends of the leads, additional solder on the frame being bonded to the solder on the metal terminals, whereby the leads are electrically connected to the terminals secured in the assembly.

3. An assembly of mounted electronic parts comprising a nonconductive substrate, thin film metal terminals on said substrate interconnecting electronic parts thereon, a fusible conductive material on and electrically connected to said terminals, a plurality of external leads extending from said substrate having ends adhered to and in electrical contact with said fusible conductive material, a nonconducting castellated frame joined to said substrate over said terminals and said leads, recesses in said castellated frame matching said terminals, separated portions of fusible material in said recesses bonded to said fusible conductive material, and portions of said frame between said recesses abutting said substrate being free of said fusible material, said frame portions isolating said separated portions of said fusible material from each other.

References Cited by the Examiner

UNITED STATES PATENTS

| | | | |
|---|---|---|---|
| 3,065,291 | 11/1962 | Rexer | 174—50.6 X |
| 3,072,832 | 1/1963 | Kilby. | |
| 3,105,868 | 10/1963 | Feign et al. | 317—101 X |
| 3,127,088 | 11/1965 | Steierman | 317—235 |

LARAMIE E. ASKIN, *Primary Examiner.*

D. L. CLAY, *Assistant Examiner.*